(12) United States Patent
Hack et al.

(10) Patent No.: US 10,483,489 B2
(45) Date of Patent: Nov. 19, 2019

(54) INTEGRATED CIRCULAR POLARIZER AND PERMEATION BARRIER FOR FLEXIBLE OLEDS

(71) Applicant: Universal Display Corporation, Ewing, NJ (US)

(72) Inventors: Michael Hack, Princeton, NJ (US); Ruiqing Ma, Morristown, NJ (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 15/235,609

(22) Filed: Aug. 12, 2016

(65) Prior Publication Data

US 2018/0047945 A1 Feb. 15, 2018

(51) Int. Cl.
*H01L 51/52* (2006.01)
*H01L 27/32* (2006.01)

(52) U.S. Cl.
CPC ...... *H01L 51/5253* (2013.01); *H01L 27/3232* (2013.01); *H01L 51/5281* (2013.01); *H01L 2251/5338* (2013.01); *H01L 2251/558* (2013.01)

(58) Field of Classification Search
CPC .............. H01L 51/5293; H01L 27/323; H01L 27/3232; H01L 51/5253; H01L 51/56; H01L 2251/5338; H01L 2251/5353; H01L 2251/558
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |

(Continued)

FOREIGN PATENT DOCUMENTS

WO 2008057394 5/2008
WO 2010011390 1/2010

OTHER PUBLICATIONS

"Birefringence in Liquid Crystals", Case Western Reserve PLC Virtual Lab, Jun. 7, 2016, 4 pp.

(Continued)

*Primary Examiner* — Fernando L Toledo
*Assistant Examiner* — Neil R Prasad
(74) *Attorney, Agent, or Firm* — Morris & Kamlay LLP

(57) ABSTRACT

Devices and techniques for fabricating such devices are provided, which include an optical system having a combined permeation barrier and circular polarizer. The optical system is relatively thin and flexible, thereby allowing for OLED displays and similar devices that reduce glare while being suitable for use in flexible displays and similar devices.

23 Claims, 3 Drawing Sheets

(56) References Cited

U.S. PATENT DOCUMENTS

| | | | |
|---|---|---|---|
| 7,968,146 B2 | 6/2011 | Wagner et al. | |
| 8,436,533 B2 * | 5/2013 | Wagner | C23C 16/0245 313/483 |
| 2002/0153523 A1 | 10/2002 | Bernius et al. | |
| 2003/0230980 A1 | 12/2003 | Forrest et al. | |
| 2004/0033373 A1 | 2/2004 | Rose et al. | |
| 2004/0174116 A1 | 9/2004 | Lu et al. | |
| 2005/0051525 A1 | 3/2005 | Yamada et al. | |
| 2007/0052660 A1 * | 3/2007 | Montbach | G02B 26/005 345/102 |
| 2008/0197518 A1 * | 8/2008 | Aylward | G02B 5/3083 264/1.34 |
| 2008/0237181 A1 | 10/2008 | Wagner et al. | |
| 2011/0013278 A1 * | 1/2011 | Hirayama | C08G 63/195 359/489.01 |
| 2013/0155723 A1 * | 6/2013 | Coleman | G02B 6/0018 362/621 |
| 2013/0241076 A1 | 9/2013 | Mandlik et al. | |
| 2015/0325813 A1 * | 11/2015 | Haag | G02B 27/281 257/40 |
| 2016/0056414 A1 * | 2/2016 | Harikrishna Mohan | H01L 51/0097 257/40 |
| 2016/0118621 A1 | 4/2016 | Harikrishna Mohan et al. | |

OTHER PUBLICATIONS

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Hack, et al., "Status and Opportunities for High Efficiency OLED Displays on Flexible Substrates", Mater. Res. Soc. Symp. Proc. vol. 870E, 2005, 10 pp.

* cited by examiner

INTEGRATED CIRCULAR POLARIZER AND PERMEATION BARRIER FOR FLEXIBLE OLEDS

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to optical systems and techniques for fabricating such systems, such as for use with or within organic light emitting diodes, which provide integrated polarization and permeation barrier, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

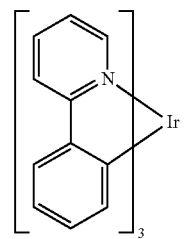

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, an optical system such as for use with an OLED or similar device is provided, which includes a first layer comprising a birefringent material, a polarizer layer, and a permeation barrier disposed between the first layer and the polarizer layer. A second permeation barrier may be disposed adjacent to the first layer such that the first layer is disposed between the first and second permeation barriers. The footprint of the first layer may be smaller than that of the first and/or second permeation barriers. The first layer may include, for example, a quarter-wave plate. The polarizer layer may include, for example, a linear polarizer. Each permeation barrier may be not more than 10 μm or not more than 5 μm thick. Each permeation barrier may be formed of one or more inorganic materials. The permeation barrier may be at least 50% transparent within the visible spectrum. The optical system may be not more than 50, 25, or 10 μm thick, and may be flexible to a radius of curvature of 10, 5, 1, or 0.5 mm or less. The refractive index of the first permeation barrier may be between an ordinary and an extraordinary refractive index of the first layer. The system may be incorporated into a device such as a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a virtual reality display, an augmented reality display, a 3-D display, a vehicle, a large area wall, a theater or stadium screen, a sign, or combinations thereof.

In an embodiment, a device including an OLED and an optical system as disclosed herein is provided. The device may include an additional barrier film, cover layer, or other protective layer disposed over the polarizer layer. The layer may include a touch sensor or other similar component. A second permeation barrier as used with the optical system may be disposed between the first layer and the OLED. The display may be flexible, transparent, or a combination thereof.

In an embodiment, a method is provided for fabricating a device including an optical system as disclosed herein. Such a method may include disposing a first permeation layer over an OLED, coating at least a portion of the permeation layer with a birefringent material such as a liquid crystal material and curing the material to form a birefringent layer, depositing a second permeation barrier over the birefringent layer, coating at least a portion of the second permeation barrier with a polarizer material such as a liquid crystal material, and curing the polarizer material to form a polarizer layer. A third permeation barrier may be fabricated over the polarizer layer. Each of the birefringent material and/or the polarizer material may be deposited with ink-jet, flash evaporation, slot die coating, spin coating, or any other suitable technique. Each layer may be cured by applying linearly-polarized and/or UV light to the material, by applying heat to remove an associated solvent, or any other suitable technique. The second permeation barrier layer may be treated with a deposition coating prior to coating the second permeation layer with the polarizer material.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
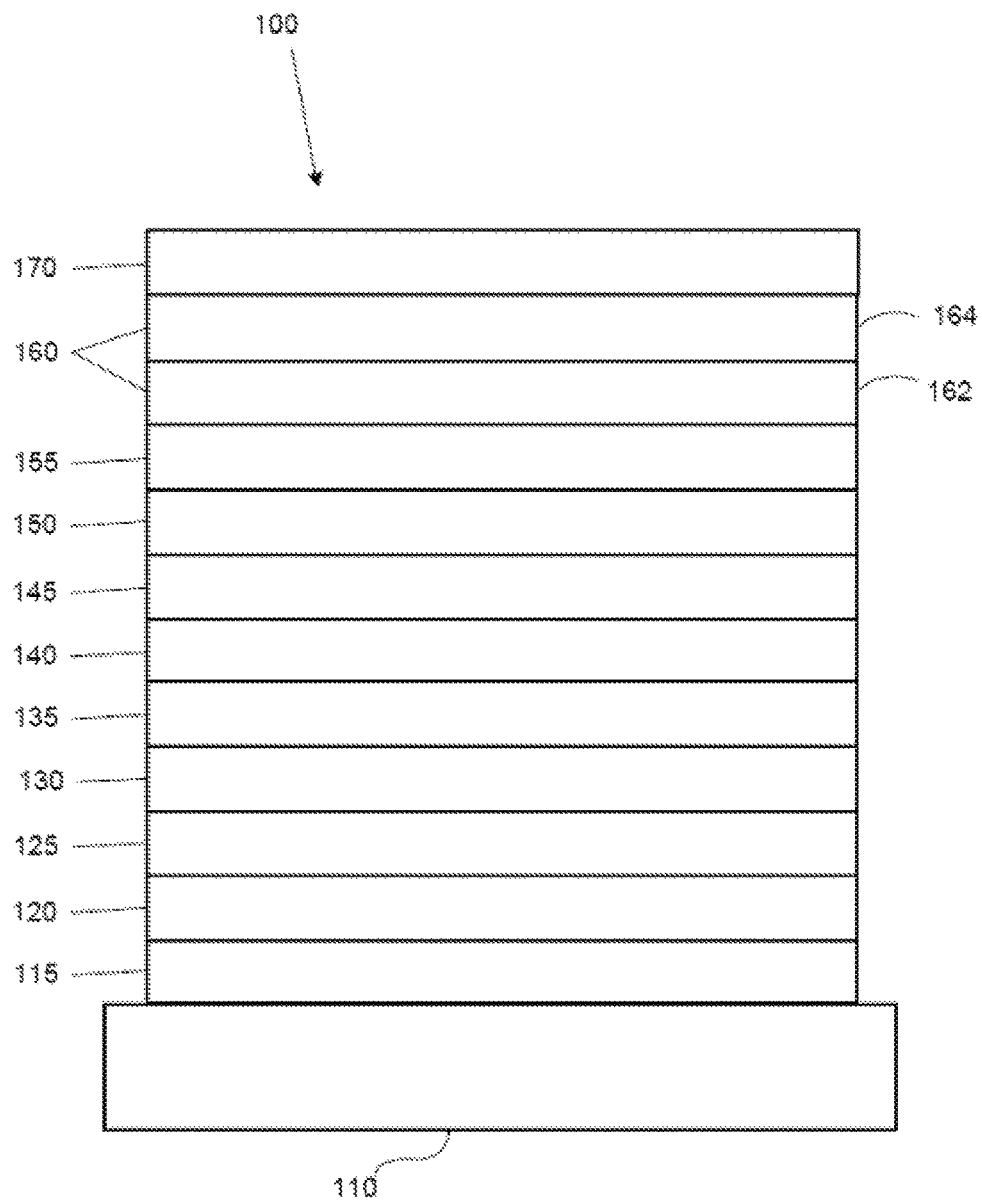
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
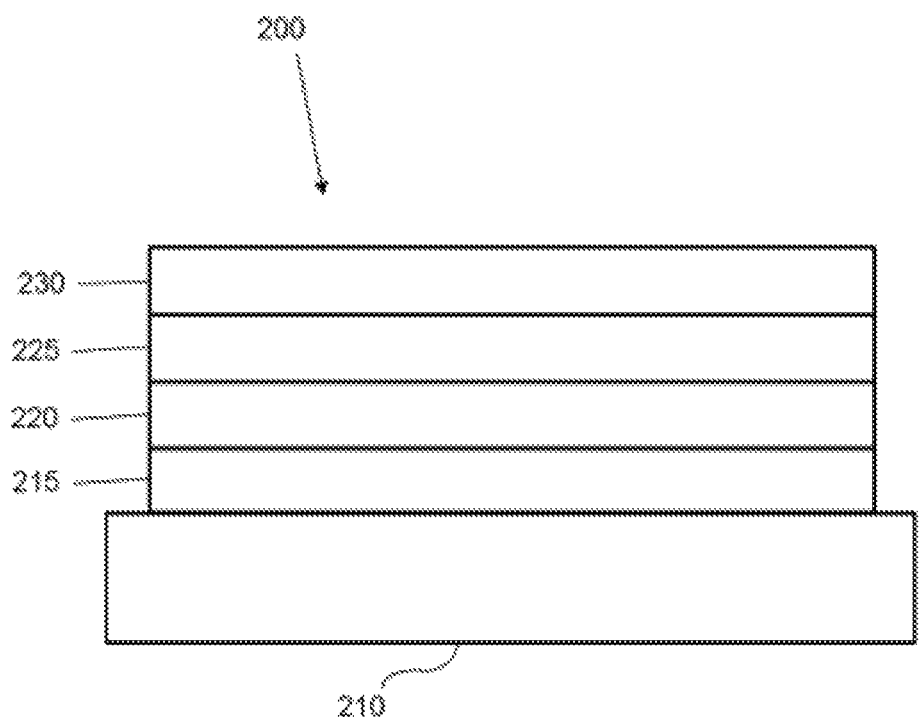
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic, an organic compound, or both, or an inorganic/organic hybrid layer. A preferred barrier layer may include a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, an augmented reality display, a virtual reality display, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

OLED displays often use circular polarizers, which typically are a combination of a linear polarizer and a quarter wave plate or reverse dispersion layer, to reduce the reflection of incident light and thereby provide higher contrast ratios, particularly for outdoor viewing. However, current solutions are too thick to enable a high degree of flexibility, for example down to 1 mm radius of curvature, which may be desirable in many applications for which OLED displays are suited, such as in rollable or foldable displays. It has been found that liquid crystal based polarizers offer the ability to be coated as thin films so as to perform as both a linear polarizer or other similar structure, and also as a quarter wave plate or similar structure, as thin films. Further, flexible OLED displays often may benefit from the inclusion of a thin transparent permeation barrier to prevent degradation of the display due to environmental factors such as moisture. The present disclosure provides techniques and structures that integrate a permeation barrier with a circular polarizer or components that otherwise provide circular polarization, to provide an integrated barrier/polarizer. Such a structure may be more beneficial than the use of separate components to provide polarization and barrier attributes. In some configurations, the polarizer components may act as planarization layers to decouple permeation barrier layers so as to improve their barrier performance, thereby making them less sensitive to particulates. Alternatively or in addition, a barrier layer as disclosed herein may act as a spacer layer to prevent a quarter wave plate or equivalent structure from causing an incorrect alignment in a linear polarizer or similar structure that is arranged over the barrier layer. In addition, the integrated polarizer/barrier structure may be thinner, and therefore more flexible and more transparent, than in configurations in which a barrier layer and a polarizer are applied as separate and discrete components of a display or other device.

When light enters a birefringent material, such as a nematic liquid crystal sample, the resulting light may be modeled as having fast (ordinary) and slow (extraordinary) components. Light traveling through and exiting such a material will take one of the two paths depending on its polarization. Because the two components travel at different velocities, the resulting light is out of phase and, upon recombining as exiting the material, the polarization state has changed due to the phase difference.

The birefringence of a particular material may be characterized by the difference, $\Delta n$, in the ordinary and extraordinary indices of refraction for material, i.e., the indices associated with ordinary and extraordinary rays of light traveling through the material. A positive $\Delta n$ thus describes a positive uniaxial material, such as nematic liquid crystals are in this category. For typical nematic liquid crystals, $\Delta n$ often is in the range of 0.05-0.5.

The phase difference between ordinary and extraordinary rays accumulates as long as the light propagates through a birefringent material. Thus, any desired polarization state may be produced based upon the birefringence of the material, i.e., $\Delta n$ for the material, and the length of the material through which the light travels.

Several techniques may be used to create circularly polarized light, thereby reducing the reflection of incident light and providing higher contrast ratios in an OLED or other display. Most commonly, a quarter-wave plate (QWP) is placed after a linear polarizer (LP). Unpolarized light is then directed through the linear polarizer. The linearly polarized light leaving the linear polarizer is transformed into circularly polarized light by the quarter wave plate. In such a configuration, the transmission axis of the linear polarizer is arranged to be at a midpoint (45°) between the fast (ordinary) and slow (extraordinary) axes of the quarter-wave plate. Circularly polarized light leaving a reverse dispersion layer and subsequently reflected from reflective layers within the OLED stack (for example, an anode or a cathode), will be reflected with opposite circular polarization such that this light can no longer pass through the linear polarizer and be seen by a user, thereby increasing the contrast ratio of the display.

To achieve an OLED display module that can be flexed to a relatively small radius of curvature, such as 1 mm, to enable rollable and foldable displays, it may be desirable for the optical system used to provide circular polarization to be as thin as possible. It further may be preferred for the optical system to include an encapsulation or other barrier system to prevent oxygen or moisture from degrading the OLED, as well as other components such as a touch sensor and circular polarizer. Conventional circular polarizers used in such devices typically include two elements, a linear polarizer and a quarter wave stack, both of which are deposited on plastic films (TAC) that are laminated onto the display surface. Typical thicknesses generally are around 50-100 µm. However, to achieve a relatively small radius of curvature, it may be desirable for the total polarizer thickness to be 10 µm or less.

According to embodiments disclosed herein, a relatively thin optical system that provides circular polarization as well as barrier protection may be achieved by depositing both a polarizer and a birefringent material directly on to an OLED display, without first depositing them onto a plastic carrier layer that is then laminated to the display.

Figure 3:
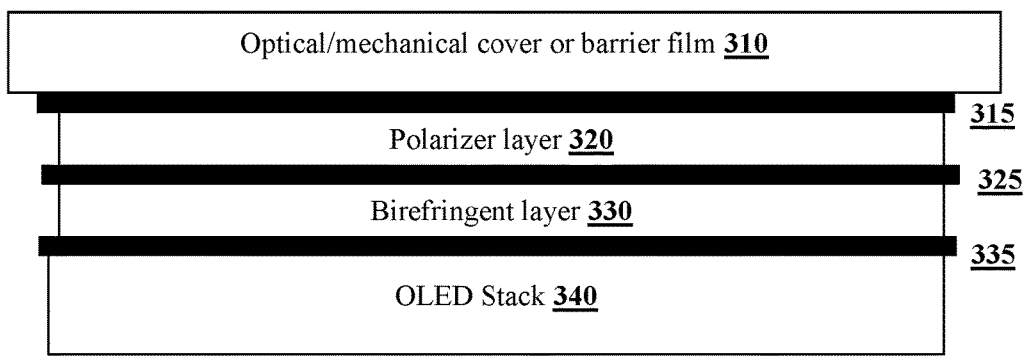
FIG. 3 shows a schematic representation of a device including an optical system as disclosed herein.

In some embodiments, it may be undesirable to deposit a polarizer directly on the birefringent material, because the molecular alignment of the birefringent material may disrupt the alignment of molecules in the linear polarizer layer, and thereby adversely affect the operation of the polarizer. Placing an intervening layer between the layers can prevent mis-alignment of the polarizer. According to embodiments disclosed herein, the intervening layer may be a permeation barrier. FIG. 3 shows an example of such a structure, in which a birefringent material layer and a polarizer layer are disposed over an OLED stack.

FIG. 3 shows an example arrangement that includes an OLED stack 340, for example as described with reference to FIGS. 1 and 2, with an optical system as disclosed herein disposed over the stack. The optical system includes a birefringent layer 330 and a polarizer 320. The birefringent layer may include, for example, a quarter-wave plate. The polarizer may include, for example, a linear polarizer. A permeation barrier 325 is disposed between the polarizer 320 and the birefringent layer 330. A second permeation barrier 335 may be disposed between the polarizer/birefringent layer combination and the OLED stack as shown. In some configurations, an optional permeation barrier 315 may be disposed adjacent to the polarizer 320, such that the polarizer 320 is between the permeation barriers 315, 325. The barrier layer 315 may be used instead of or in conjunction with a suitable optical or mechanical cover 310, which may be disposed over the OLED 340 and the optical system. Each permeation barrier 315, 325, 335 may be relatively thin as described in further detail herein, especially in comparison to other similar conventional layers that may provide some permeation protection to electronic devices, such as plastic films and other similar layers. The permeation barriers may be inorganic and may include, for example, oxide, nitride, oxynitride, hybrid barriers, or other barrier materials and layers as disclosed herein.

The permeation barrier may include oxide, nitride, oxynitride, a hybrid barrier such as disclosed in U.S. Pat. No. 8,436,533, the disclosure of which is incorporated by reference in its entirety, or any other suitable permeation barrier layer. Examples of suitable barrier layers and techniques for fabricating the same are disclosed in further detail in U.S. Pat. No. 7,968,146, the disclosure of which is incorporated by reference in its entirety. More generally, as used herein a "permeation barrier" refers to a layer designed and intended to prevent the flow of moisture and/or oxygen to an underlying layer or device such as an OLED. Thus, while other layers such as plastic films may prevent some moisture from penetrating to underlying layers, such films typically would not be considered to be permeation barrier by one of skill in the art. For example, conventional plastic films typically have a permeation to water and/or oxygen on the order of $10^{-3}$ g/cm/day or more, whereas permeation barriers disclosed herein achieve permeations several orders of magnitude lower, such as $10^{-4}$, $10^{-5}$, or $10^{-6}$ g/cm/day.

Each permeation barrier used in optical systems and devices disclosed herein may be transparent. Specifically, it may be desirable for a permeation barrier to be at least 50% transparent, more preferably 60%, more preferably 70% or more, within the visible spectrum.

A structure such as shown in FIG. 3 also may provide unexpected benefits to both the permeation and optical properties of a device. For example, the birefringent layer 330 may serve as a planarization layer to decouple the two permeation barriers 325, 335. Such an arrangement may, for example, ensure that pin-holes or other defects in a barrier film that may arise due to particulates do not propagate through to the next barrier layer. So the alignment of the polarizer layer is not transferred to the birefringent layer or vice-versa, and the resilience of the device to pin holes, particles, and the like is improved. Thus in an integrated polarizer/barrier optical system as disclosed herein, a birefringent layer such as a quarter wave plate may serve two simultaneous functions—serving as a reverse dispersion layer to rotate light polarization, and decoupling permeation barriers to provide an overall more robust permeation barrier.

According to embodiments disclosed herein, such dual function is achievable in a relatively thin and flexible format. For example, according to embodiments disclosed herein, the total thickness of the thin film permeation barrier or barriers, the birefringent layer, and the polarizer layer may be less than 50 µm, more preferably, less than 25 µm, or more preferably less than 10 µm. Including a cover film or mechanical cover, with or without touch sensors, and the underlying OLED, the total display device thickness thus may be less than about 200 µm, more preferably less than 100 or 50 µm. Combining the barrier and polarizer functions into a single integrated structure as disclosed herein thus may allow for a thinner and more flexible and/or transparent device than would otherwise be achievable if the functions were provided by separate, discrete layers.

Embodiments of hybrid polarizing/permeation optical systems disclosed herein may be relatively flexible. As used herein, such a system is considered flexible if it is bendable to a radius of curvature of not more than about 10 mm, more preferably 5 mm, more preferably 1 mm, and more preferably 0.5 mm without breaking or cracking. In addition, it may be desirable for the system to be able to be repeatedly flexed thousands or tens of thousands of times to such radii of curvature. In contrast, conventional polarization and/or permeation barrier systems generally are not able to bend to such a degree, and/or to as repeatedly, without breaking or cracking, and typically cannot achieve the relatively thin films and devices disclosed herein.

Various fabrication processes may be used to deposit the various layers of an optical system as disclosed herein. In some cases, the birefringent layer and/or the polarizer layer may benefit from photo-alignment techniques to provide correct alignment of polarizer layer molecules, such as where a liquid crystal material is used.

In an example fabrication process according to embodiments disclosed herein, a first passivation or permeation layer may be applied on top of the OLED device, such as the permeation barrier 335 shown in FIG. 3. A birefringent material may be coated over the first permeation layer. The footprint of this layer may be precisely controlled, such as by use of an ink-jet or other liquid dispensing process. Similarly, a flash evaporation using a shadow mask also may be used to precisely deposit the material. Other techniques may be used, such as slot die coating, spin coating, or any other suitable technique. After deposition, the material may be cured to form a birefringent layer such as a quarter-wave plate. For example, linearly polarized UV light may be applied to generate the asymmetric optical property used to produce a quarter-wave plate. As another example, a layer may be cured by applying heat to remove an associated solvent from the layer. Prior to deposition of the birefringent material, the surface of the first permeation layer may be treated with a coating having an appropriate surface energy or alignment property. In some embodiments, it may be preferred for the birefringent layer to have a smaller footprint than the first permeation barrier. The birefringent layer may be fabricated as a single layer or, alternatively, it may be fabricated with multiple layers, for example to achieve quarter-wave retardation. In the latter case, multiple pairs of birefringent material and barrier may be used.

An intervening layer such as a second permeation barrier 325 as shown in FIG. 3 may be deposited over the birefringent layer. It may be preferred that the footprints of the two permeation barriers are the same, and/or that both are larger than that of the birefringent layer. Examples of suitable permeation barriers include oxide, nitride, oxynitride, hybrid barriers, or other barrier materials as previously described. The refractive index of the second permeation barrier may be close to the refractive indices of the birefringent material. More preferably, the second permeation barrier may have an index between the ordinary and extraordinary indices of the birefringent material.

After the intervening permeation barrier structure, a polarizer layer may be deposited. The polarizer layer may be a linear polarizer, and it may be deposited using a process similar to that of the birefringent material. A similar curing technique also may be used. In general, photo-curing may be preferred to thermal curing techniques. To control the orientation of the polarizer layer, a surface alignment layer may be used, though such a layer generally is not required when photo-alignment techniques are used.

A third permeation barrier, optical or mechanical cover, or other protective layer may be applied over the polarizer layer, such as the cover 310 shown in FIG. 3. Generally any conventional techniques may be used to deposit or otherwise fabricate such a layer.

Optical systems as disclosed herein may be used with both top-emitting OLEDs and bottom-emitting OLEDs. In a flexible OLED device, an OLED typically is built over a thin polymer coating such as a polyimide coating, which serves as a flexible substrate. At this point, an optical system as disclosed herein may be applied to the back side of the flexible substrate. Because the substrate typically is relatively thin, for example on the order of about 10 μm, a complete system or device may achieve a relatively very thin thickness.

Any suitable material may be used for the birefringent layer and the polarizer layer as disclosed herein. For example, liquid crystal materials may be used for the birefringent layer to form a quarter-wave plate. More generally, any conventional birefringent or polarizing material may be used to fabricate each layer, respectively.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An optical system for an organic light emitting device, the optical system comprising:
    a first layer comprising a birefringent material;
    a polarizer layer; and
    a transparent first permeation barrier disposed between the first layer and the polarizer layer, wherein the first permeation barrier has a permeation not greater than $10^{-4}$ g/cm/day.

2. The optical system of claim 1, further comprising a second permeation barrier disposed adjacent to the first layer, wherein the first layer is disposed between the first and second permeation barriers.

3. The optical system of claim 1, further comprising a second permeation barrier disposed adjacent to the polarizer layer, wherein the polarizer layer is disposed between the first and second permeation barriers.

4. The optical system of claim 3, wherein the footprint of the first layer is smaller than the footprint of the second permeation barrier.

5. The optical system of claim 1, wherein the footprint of the first layer is smaller than the footprint of the first permeation barrier.

6. The optical system of claim 1, wherein the first layer comprises a quarter-wave plate.

7. The optical system of claim 1, wherein the polarizer layer comprises a linear polarizer.

8. The optical system of claim 1, wherein the first permeation barrier is not more than 10 μm thick.

9. The optical system of claim 7, wherein the first permeation barrier is not more than 5 μm thick.

10. The optical system of claim 1, wherein the permeation barrier is inorganic.

11. The optical system of claim 1, wherein the optical system is not more than 50 μm thick.

12. The optical system of claim 1, wherein the refractive index of the first permeation barrier is between an ordinary refractive index and an extraordinary refractive index of the first layer.

13. The optical system of claim 1, wherein the system is incorporated into a device comprising at least one selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a virtual reality display, an augmented reality display, a 3-D display, a vehicle, a large area wall, a theater or stadium screen, and a sign.

14. A display comprising:
    an organic light emitting diode (OLED); and
    an optical system as recited in claim 1, disposed over the OLED.

15. A method of fabricating a display, comprising:
    disposing a first permeation layer over an organic light emitting diode (OLED), wherein the first permeation barrier has a permeation not greater than $10^{-4}$ g/cm/day;
    coating at least a portion of the first permeation layer with a birefringent material and curing the birefringent material to form a birefringent layer;

depositing a second permeation barrier over the birefringent layer; and coating at least a portion of the second permeation layer with a polarizer material and curing the polarizer material to form a polarizer layer.

16. The method of claim 15, further comprising fabricating a third permeation barrier over the polarizer layer.

17. The method of claim 15, wherein coating at least the portion of the first permeation layer with the birefringent material comprises depositing the birefringent material via an ink-jet process, flash evaporation, slot die coating, or spin coating.

18. The method of claim 15, wherein curing the birefringent material comprises applying heat or linearly-polarized light to the birefringent material.

19. The method of claim 15, wherein coating at least the portion of the second permeation layer with the polarizer material comprises depositing the polarizer material via an ink-jet process, flash evaporation, slot die coating, or spin coating.

20. The method of claim 15, wherein curing the polarizer material comprises applying heat or linearly-polarized light to the polarizer material.

21. The optical system of claim 1, wherein the first permeation barrier has a permeation of not more than $10^{-5}$ g/cm/day.

22. The optical system of claim 21, wherein the first permeation barrier has a permeation of not more than $10^{-6}$ g/cm/day.

23. The optical system of claim 2, wherein the second permeation barrier has a permeation not greater than $10^{-4}$ g/cm/day.

* * * * *